US006831362B2

(12) United States Patent
Ha et al.

(10) Patent No.: US 6,831,362 B2
(45) Date of Patent: Dec. 14, 2004

(54) DIFFUSION BARRIER LAYER FOR SEMICONDUCTOR DEVICE AND FABRICATION METHOD THEREOF

(75) Inventors: Jae-Hee Ha, Cheongju (KR); Hong Koo Baik, Seoul (KR); Sung-Man Lee, Chuncheon (KR)

(73) Assignee: LG Semicon Co., Ltd., Choongcheonbuk-do (KR)

( * ) Notice: Subject to any disclaimer, the term of this patent is extended or adjusted under 35 U.S.C. 154(b) by 0 days.

(21) Appl. No.: 10/270,351

(22) Filed: Oct. 15, 2002

(65) Prior Publication Data

US 2003/0047811 A1 Mar. 13, 2003

Related U.S. Application Data

(60) Division of application No. 09/233,040, filed on Jan. 20, 1999, now Pat. No. 6,482,734, which is a continuation-in-part of application No. 09/196,330, filed on Nov. 19, 1998, now abandoned.

(30) Foreign Application Priority Data

Jan. 20, 1998 (KR) .......................................... 98-001544

(51) Int. Cl.[7] .............................................. H01L 29/40
(52) U.S. Cl. ...................................... 257/751; 257/700
(58) Field of Search ................................ 257/751, 700; 29/571, 578

(56) References Cited

U.S. PATENT DOCUMENTS

| | | | |
|---|---|---|---|
| 4,558,507 A | * 12/1985 | Okabayashi et al. | 29/571 |
| 5,275,715 A | * 1/1994 | Tuttle | 205/123 |
| 5,502,004 A | 3/1996 | Park | |
| 5,605,724 A | 2/1997 | Hong et al. | |
| 5,637,533 A | 6/1997 | Choi | |
| 5,665,628 A | 9/1997 | Summerfelt | |
| 5,753,945 A | 5/1998 | Chivukula et al. | |
| 5,892,254 A | 4/1999 | Park et al. | |
| 5,939,787 A | * 8/1999 | Lee | 257/740 |
| 5,985,758 A | 11/1999 | Kim | |
| 5,998,870 A | * 12/1999 | Lee et al. | 257/751 |

(List continued on next page.)

FOREIGN PATENT DOCUMENTS

| | | |
|---|---|---|
| EP | 0722190 A2 | 7/1996 |
| JP | 7335759 A | 12/1995 |
| JP | 8139092 A | 5/1996 |

OTHER PUBLICATIONS

Stanley Wolf et al., Silicon Processing for the VLSI Era, vol. 1: Process Technology, pp. 175, 176 and 261.
Stanley Wolf et al., Silicon Processing for the VLSI Era, vol. 2: Process Integration, pp. 121–125.
McGraw–Hill, Inc., "VLSI Technology", Second Edition, pp. 16 and 308–310.
E. Kolowa et al. "Sputtered Ta–Si–N Diffusion Barriers in Cu Metallizations for Si", IEEE Electron Device Letters, vol. 12, No. 6 (Jun. 1991).

*Primary Examiner*—Roy Potter
(74) *Attorney, Agent, or Firm*—Birch, Stewart, Kolasch & Birch, LLP

(57) ABSTRACT

The present invention relates to a diffusion barrier layer for a semiconductor device and fabrication method thereof. The diffusion barrier layer according to the present invention is fabricated by forming a diffusion barrier layer containing a refractory metal material and an insulating material on an insulating layer and in a contact hole, wherein the insulating layer being partially etched to form the contact hole, is formed on a semiconductor substrate; and annealing the diffusion barrier layer. Therefore, an object of the present invention is to provide a diffusion barrier layer for a semiconductor device, which is of an amorphous or microcrystalline state and thermodynamically stable even at a high temperature since an insulating material is bonded to a refractory metal material in the diffusion barrier layer.

9 Claims, 7 Drawing Sheets

U.S. PATENT DOCUMENTS

| | | |
|---|---|---|
| 6,051,492 A | 4/2000 | Park et al. |
| 6,110,598 A * | 8/2000 | Maeda et al. ............... 428/457 |
| 6,177,284 B1 | 1/2001 | Horii et al. |
| 6,436,825 B1 * | 8/2002 | Shue ........................... 438/687 |
| 6,518,668 B2 * | 2/2003 | Cohen ......................... 257/751 |

* cited by examiner

DIFFUSION BARRIER LAYER FOR SEMICONDUCTOR DEVICE AND FABRICATION METHOD THEREOF

This application is a divisional of application Ser. No. 09/233,040, filed on Jan. 20, 1999, now U.S. Pat. No. 6,482,734 which is a CIP of Ser. No. 09/196,330 filed Nov. 19, 1998, now abandoned the entire contents of which are hereby incorporated by reference and for which priority is claimed under 35 U.S.C. § 120; and this application claims priority of application No. 1544/1998 filed in Korea on Jan. 20, 1998 under 35 U.S.C. § 119.

FIELD OF THE INVENTION

The present invention relates to a semiconductor device, and more particularly to a diffusion barrier layer for a semiconductor device and a fabrication method thereof which is stable even at a high temperature by combining an insulating material and a refractory metal.

BACKGROUND OF THE INVENTION

A diffusion barrier layer in a semiconductor device delays diffusion or prevents a chemical reaction between an interconnection material and a substrate material or between interconnection materials. Therefore, a stable diffusion barrier layer is essential for the development of reliable semiconductor devices. Since it is almost impossible for the diffusion barrier layer to completely prevent the diffusion, the performance of the diffusion barrier layer depends upon how long the diffusion barrier layer can play its part under various annealing conditions. The diffusion barrier layer is required to have properties, such as being stable thermodynamically even when being in contact with the interconnection and the substrate material, having low contact resistance and excellent adhesivity, being tolerable to thermal and mechanical stress and having high electric conductivity. Further, it is desirable that a coefficient of thermal expansion of the diffusion barrier layer is similar to that of the substrate material.

Such diffusion barrier layer is mainly divided into a passive barrier, a sacrificial barrier and a stuffed barrier. More specifically, the passive barrier prevents the reaction with the interconnection and the substrate material by using a material which is thermodynamically stable and chemically inert. The sacrificial barrier layer reacts with the interconnection material or the substrate material, but the reaction is very slow. Thus, the sacrificial barrier layer serves as the diffusion barrier layer until it is exhausted due to the reaction with the interconnection material or the substrate material. Lastly, the stuffed barrier prevents the diffusion by filling other materials into grain boundaries that become the paths of the diffusion. Here, the diffusion barrier layer according to the present invention belongs to the stuffed barrier. As mentioned above, stuffing implies filling of other material into the grain boundaries.

Generally, the grain boundaries have been known as fast diffusion paths, since the diffusion along the grain boundaries occurs much more easily than through crystallites in a polycrystalline thin film. Therefore, to prevent the diffusion along the grain boundaries, single crystal or amorphous material which has no grain boundary, or the stuffed film in which other materials are filled in the grain boundaries is used as conventional diffusion barrier layers. Among the conventional diffusion barrier layers, however, the amorphous diffusion barrier layer which is thermodynamically unstable is transformed into a crystalline structure and thus there exists grain boundaries.

As a fabrication method of the conventional stuffed barrier layer, there is a method for blocking the grain boundaries by precipitating into the grain boundaries a precipitation, or implanting a material into the grain boundaries by diffusing a impurity gas in the atmosphere. Most popular examples are nitrogen stuffing and oxygen stuffing. Particularly, the nitrogen stuffing is to precipitate nitrogen into grain boundaries by depositing a thin film which contains nitrogen in excess of its limit. The oxygen stuffing is to implant oxygen into the grain boundaries by performing the oxygen plasma treatment or annealing in oxygen atmosphere after thin film deposition. Using such implantation, nitrogen can be implanted.

However, in these methods, since nitrogen or oxygen is weakly bound with the matrix thin film, the stuffing effect becomes extinct when the annealing process is performed for a long time. Also, in implantation by using the plasma treatment, the thin film is damaged due to high ion energy, which results in bond break in the thin film and crystal defects such as dislocation, void and interstitial, etc.

SUMMARY OF THE INVENTION

Accordingly, the present invention is directed to a diffusion barrier layer and a fabrication method thereof that obviate the problems according to the related art.

An object of the present invention is to provide a diffusion barrier layer for a semiconductor device that is thermodynamically stable even at a high temperature and a fabrication method thereof.

To achieve these and other advantages and in accordance with the purpose of the present invention, as embodied and broadly described, there is provided a diffusion barrier layer including an insulating material and a refractory metal, the insulating material being bonded to the refractory metal material and the diffusion barrier layer being in a microcrystalline or amorphous state.

Further, in order to achieve to the object of the present invention, there is provided a fabrication method of a diffusion barrier layer for a semiconductor device includes the steps of: forming a diffusion barrier layer containing a refractory metal material and an insulating material on an insulating layer and in a contact hole, wherein the insulating layer being partially etched to form the contact hole is formed on a semiconductor substrate; and annealing the diffusion barrier layer.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Reference will now be made in detail to the preferred embodiments of the present invention, examples of which are illustrated in the accompanying drawings.

Figure 1A:
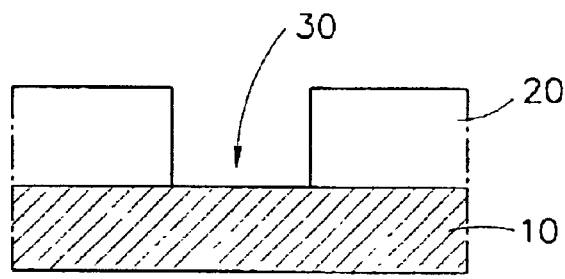
FIGS. 1A-1C are vertical cross-sectional diagrams sequentially illustrating a method of fabricating a diffusion barrier layer of a semiconductor device according to the present invention.
Figure 1B:
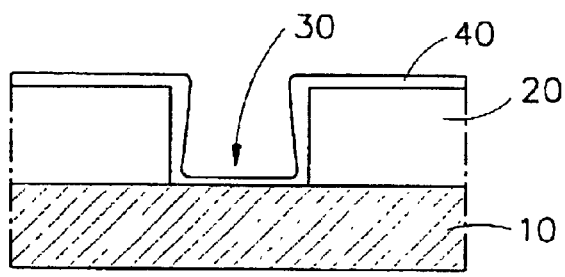
Figure 1C:
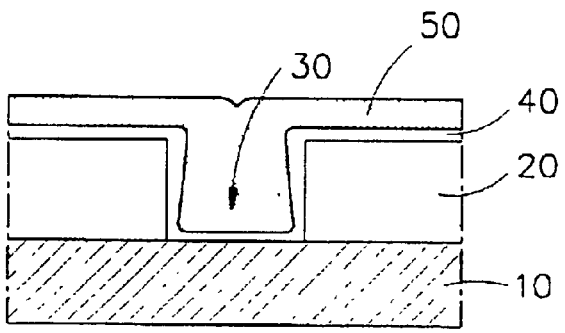

FIGS. 1A-1C are vertical cross-sectional diagrams sequentially illustrating a fabrication method of a diffusion barrier layer of a semiconductor device according to the present invention.

First, FIG. 1A shows a cross-sectional diagrams in which a contact hole 30 is formed by etching a predetermined portion of an insulating layer 20 applied on a semiconductor substrate 10. As shown in FIG. 1B, a diffusion barrier layer 40 consisting of Ta—CeO$_2$ is formed on the insulating layer 20 and in the contact hole 30 by co-sputtering and then an annealing process is performed at a temperature of 750° C. for 30 minutes to the Ta—CeO$_2$, diffusion barrier layer 40 for achieving the thermal stabilization thereof.

Such co-sputtering deposition employs a first target containing Ta, a refractory metal, and a second target containing CeO$_2$, an insulating material. While the diffusion barrier layer 40 can be formed in other ways such as a sputtering deposition using a target or a pellet which contains the refractory metal material and the insulating material. The diffusion barrier layer 40 can be formed in other ways such as any kind of chemical vapor deposition, including a chemical vapor deposition which employs a compound containing the refractory metal material and the insulating material in CVD equipment.

Here, it is noted that at least one of 4B, 5B and 6B groups is used as the refractory metal, the 4B, 5B and 6B groups including Ti, Ta, Mo and W, and the insulating material consists of oxide or nitride. Further, the annealing process is performed for at least 10 minutes and preferably for 10 minutes to an hour, at a temperature of 450° C. to 750° C. Here, it is noted that the optimum conditions of the annealing process are determined by a material of an interconnection to be formed in a following process.

Accordingly, the fabrication of the diffusion barrier layer is completed and then followed by a next process including the forming of the interconnection. That is, as shown in FIG. 1C, an interconnection 50 is formed on the diffusion barrier layer 40, the interconnection 50 consisting of at least one of Al, Al alloy, Cu and Cu alloy.

Figure 2:
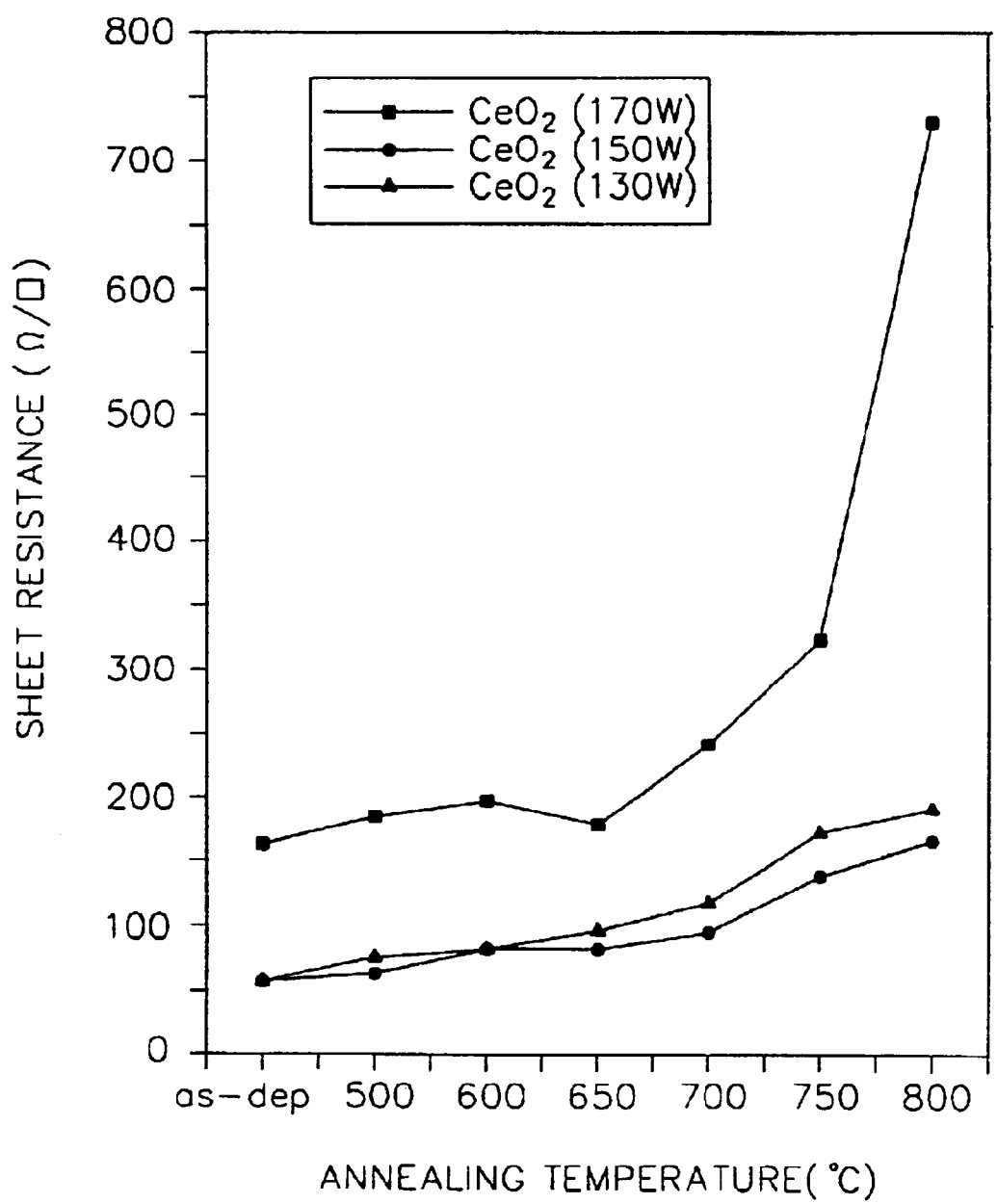
FIG. 2 is a graph illustrating sheet resistance of a Ta—CeO$_2$ diffusion barrier layer that has been subjected to annealing between 500° C. and 800° C. at various sputtering powers according to an embodiment of the present invention.

FIG. 2 illustrates relation between sheet resistance of the Ta—CeO$_2$ diffusion barrier layer and annealing temperature when the Ta—CeO$_2$ diffusion barrier layer is deposited at a thickness of 100 nm according to the embodiment of the present invention and annealed between 500° C. and 800° C. at various sputtering powers (e.g., 130 W, 150 W and 170 W) in a vacuum. As shown therein, the sheet resistance of the Ta—CeO$_2$ diffusion barrier layer is considerably low in the measuring range, except for which the sputtering power is 170 W and the annealing temperature is about 800° C. The thin film formed at 170 W of sputtering power and annealed at 800° C., shows relatively high sheet resistance, because much CeO$_2$ is present in the diffusion barrier layer. However, although the sheet resistance in the above case is relatively high among sheet resistance values, it still belongs to a range of low sheet resistance values required for the diffusion barrier layer. Therefore, the diffusion barrier layer has an excellent property, that is, low sheet resistance in the entire measuring range when the Ta—CeO$_2$ diffusion barrier layer is formed at 130 W, 150 W and 170 W of sputtering power and annealed at the temperatures from 500° C. to 800° C.

Figure 3:
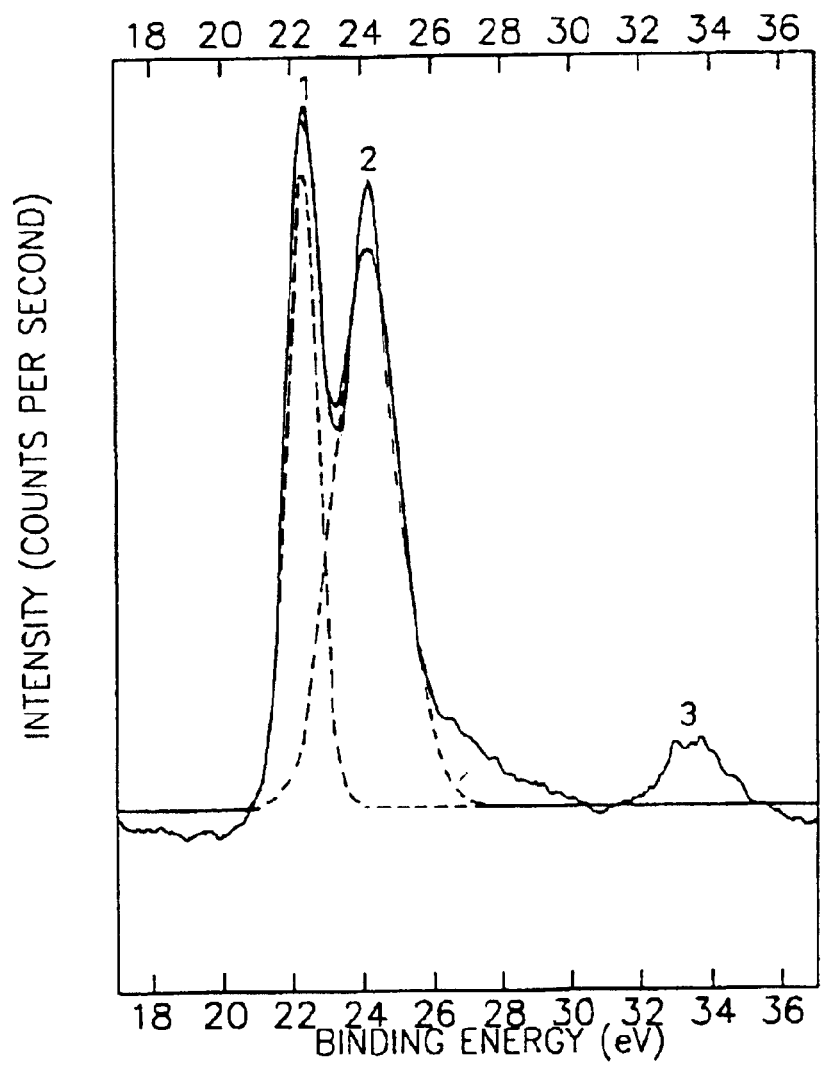
FIG. 3 is a graph showing Ta 4f XPS spectra of a Ta thin film.

The diffusion barrier layer according to the present invention maintains the low sheet resistance even at the high temperature of 800° C., because CeO$_2$ stuffed in the Ta—CeO$_2$ diffusion barrier layer is not just filled therein, but bonded to Ta. The above fact can be certified by analyzing Ta bonds by performing X-ray photoelectron spectroscopy (XPS). FIG. 3 shows Ta 4f XPS spectra when only Ta is deposited by a sputtering method. As shown therein, there are shown three spectra at about 22 eV (1), 24 eV (2) and 34 eV (3), respectively. Therefore, there exist bonds having binding energy of about 22 eV, 24 eV and 34 eV, respectively, in the Ta thin film, and the three peaks (1, 2, 3) are the specific spectra of Ta 4f.

Figure 4:
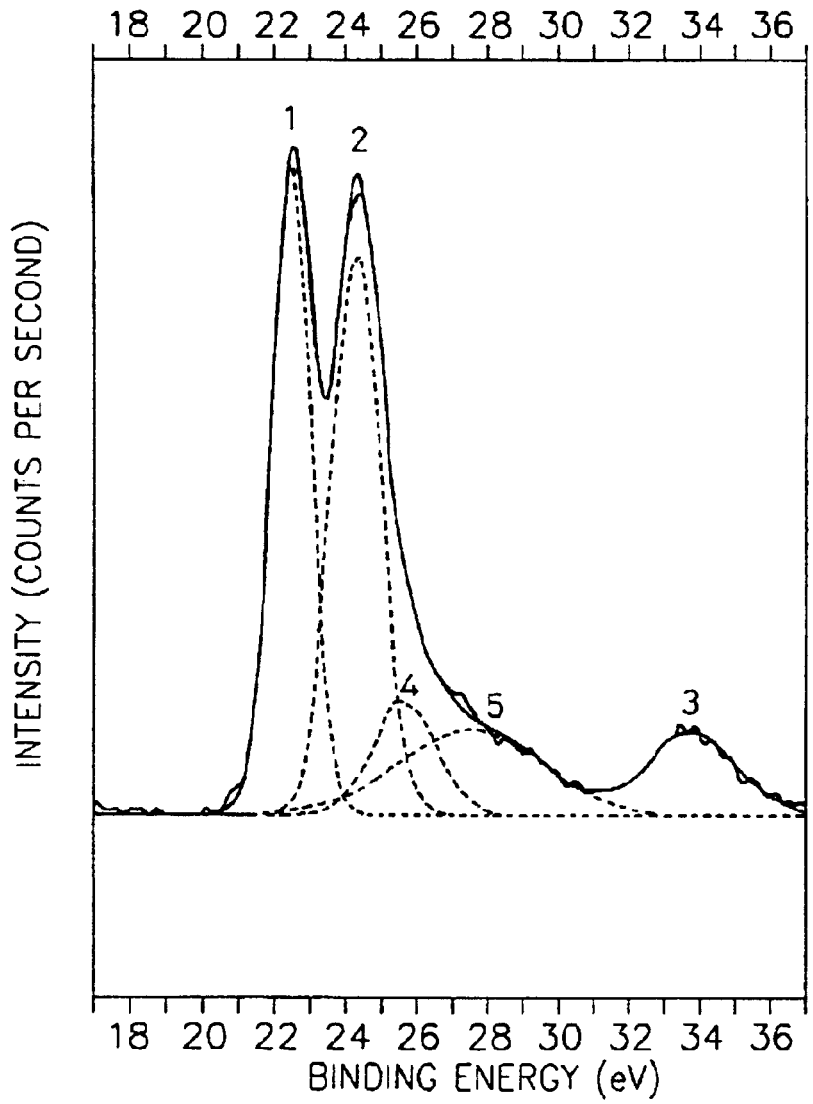
FIG. 4 is a graph showing Ta 4f XPS spectra of a Ta—CeO$_2$ diffusion barrier layer formed at 150 W of sputtering power without an annealing process according to the present invention.

FIG. 4 shows Ta 4f XPS spectra for a Ta—CeO$_2$ diffusion barrier layer formed at 150 W of the sputtering power without annealing. As can be seen, two more peaks are shown at about 26 eV (4) and 28 eV (5), respectively, in addition to the three peaks (1, 2, 3) of 22 eV, 24 eV and 34 eV, respectively as shown in FIG. 3. Such two more peaks (4, 5) result from Ta—O—Ce bond and Ta—O—Ce bond, because, when Ta—CeO$_2$ are deposited, some oxygen, decomposed from the CeO$_2$ target, is combined with Ta in a plasma condition. Here, it is noted that the peak (4) at about 26 eV further increases after the annealing process.

Figure 5:
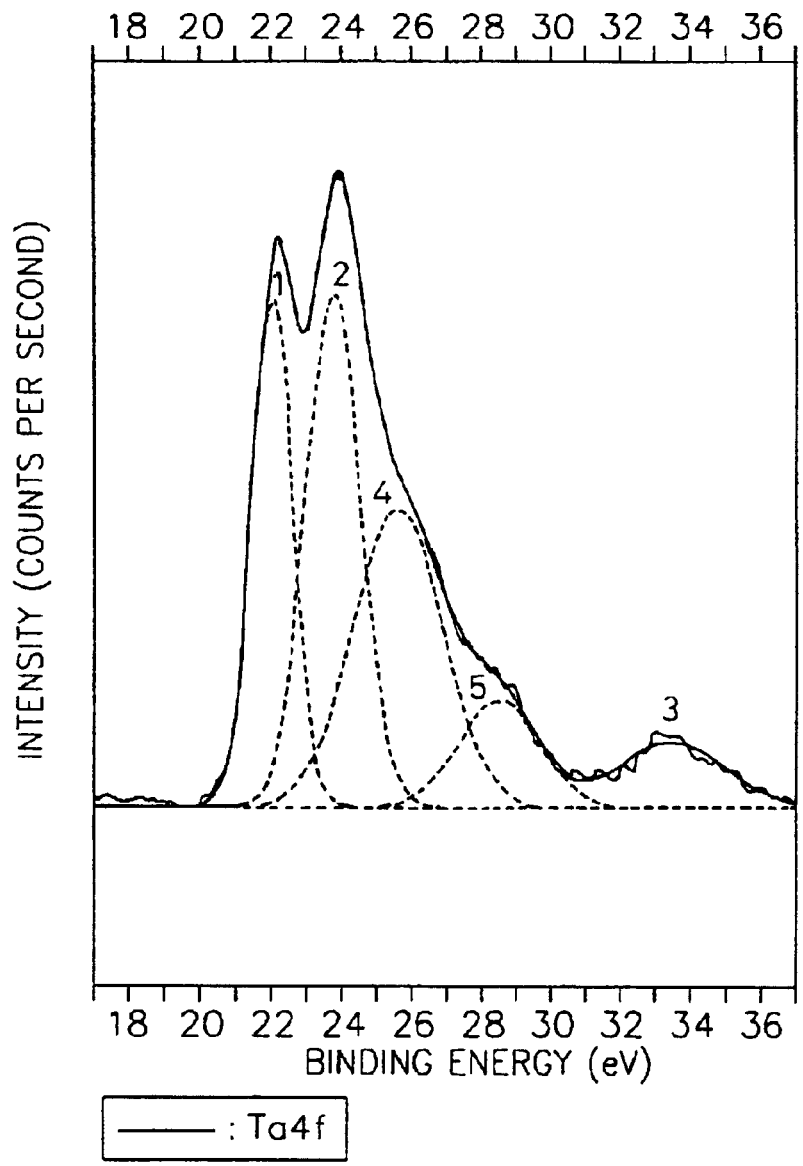
FIG. 5 is a graph showing Ta 4f XPS spectra of a Ta—CeO$_2$ diffusion barrier layer formed at 150 W of sputtering power and annealed at a temperature of 800° C. according to the present invention.

FIG. 5 illustrates Ta 4f XPS spectra for a Ta—CeO$_2$ diffusion barrier layer formed at 150 W of the sputtering power and annealed at a temperature of 800° C. As shown therein, peaks (1, 2, 3) of the Ta thin film itself are shown at around 22 eV, 24 eV and 34 eV, respectively and the peak (4) at around 26 eV is considerably increased. Therefore, it can be realized that the annealing process increases the bond number of Ta and oxygen. Consequently, XPS shows that CeO$_2$ which is the insulating material is not simply filled in the Ta—CeO$_2$, diffusion barrier layer, but bonded to Ta which is the refractory metal. Further, as mentioned above, the diffusion barrier layer according to the present invention is in a microcrystalline or amorphous state, and which can be seen from X-ray diffraction (XRD) patterns.

Figure 6:
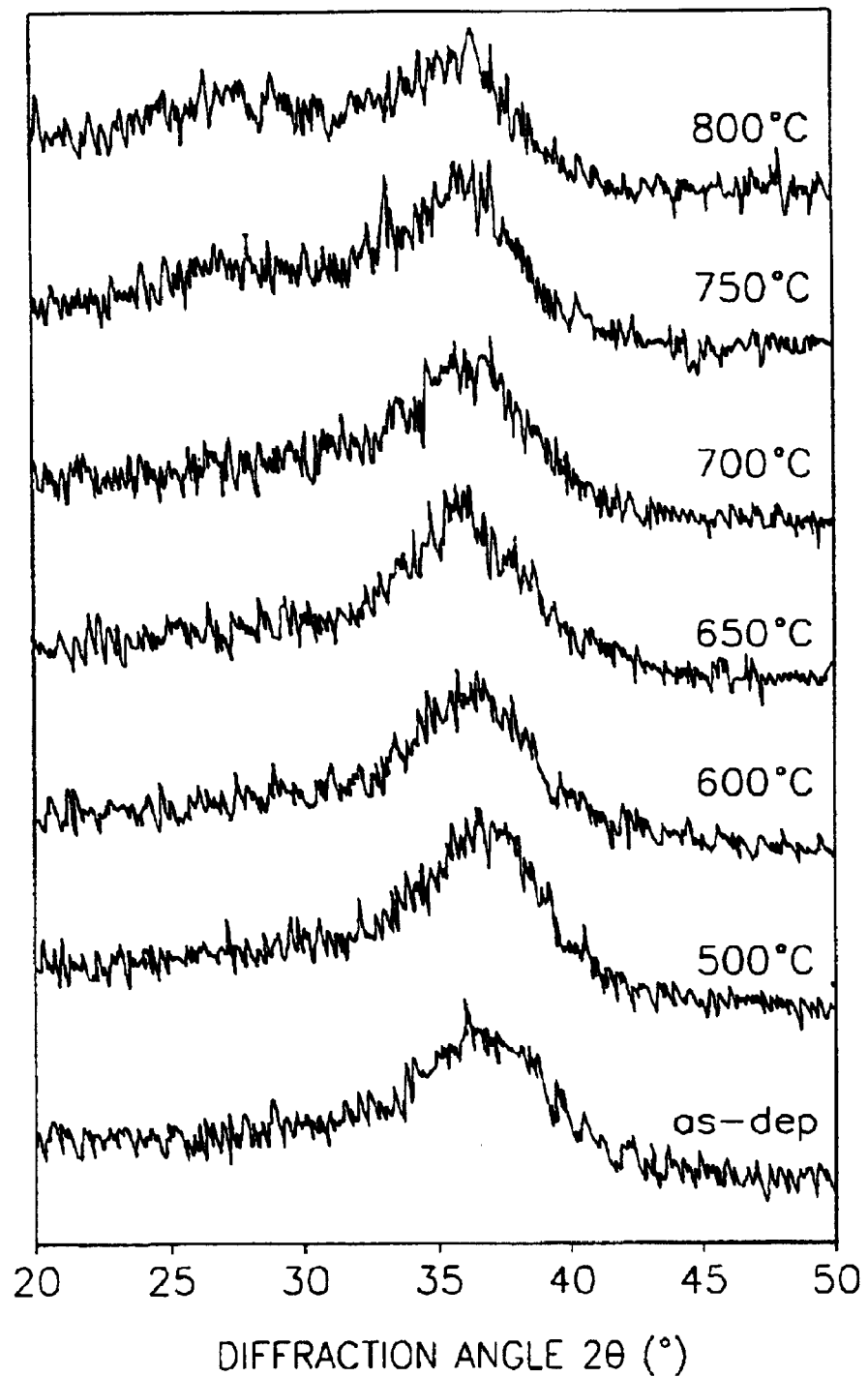
FIG. 6 is a graph illustrating XRD patterns of a Ta—CeO$_2$, diffusion barrier layer formed at 170 W of sputtering power and annealed at various temperatures according to the present invention.

FIG. 6 illustrates XRD patterns of a Ta—CeO$_2$ diffusion barrier layer formed at a thickness of 100 nm at 170 W of the sputtering power and annealed for about 30 minutes at various temperatures according to the present invention. As shown therein, in the XRD patterns when the diffusion barrier layer is formed without the annealing process, there appears a broad peak at about 37°, showing that the Ta—CeO$_2$ layer is an amorphous or microcrystalline state. The broad peak showing the amorphous or microcrystalline state has no change even if annealing temperature is increased up to 800° C. Accordingly, it can be seen that the Ta—CeO$_2$ diffusion barrier layer according to the present invention maintains its microcrystalline or amorphous state even at the high temperature, for example, at 800° C.

Further, any peak of Ta-silicide crystal generated by a reaction between Ta and the Si substrate, can not be seen, showing that the Ta—CeO$_2$ diffusion barrier layer according to the present invention has an excellent property that does not react on the semiconductor substrate.

Figure 7:
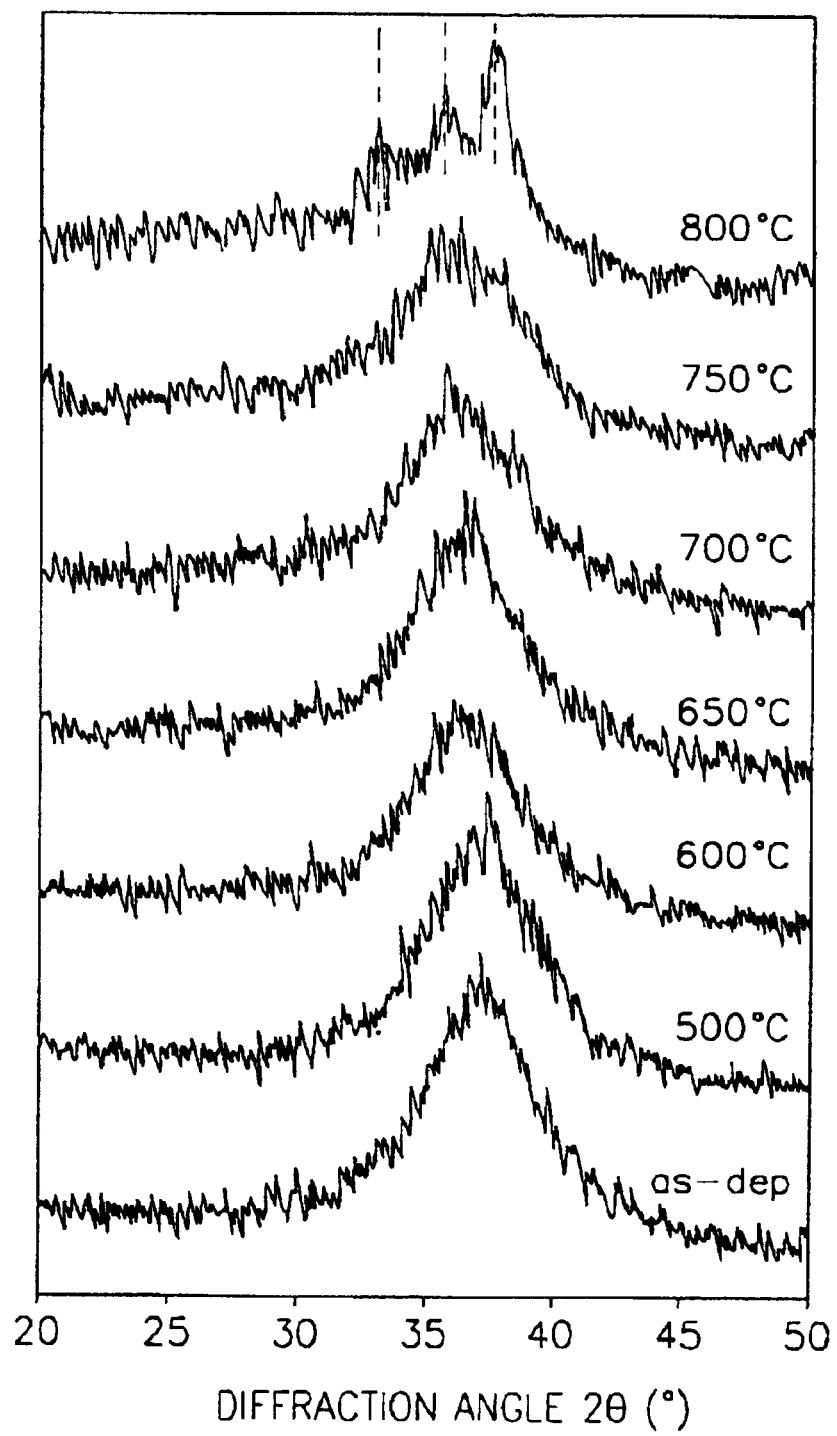
FIG. 7 is a graph illustrating XRD patterns of a Ta—CeO$_2$ diffusion barrier layer formed at 150 W of sputtering power and annealed at various temperatures according to the present invention.

FIG. 7 illustrates XRD patterns of a Ta—CeO$_2$, diffusion barrier layer deposited at a thickness of 100 nm at 150 W which is different from the sputtering power of FIG. 6 and annealed for about 30 minutes at various temperatures according to the present invention. As shown therein, the Ta—CeO$_2$ layer deposited in the sputtering power of 150 W is still of the amorphous or microcrystalline state up to an annealing temperature of 750° C. However, when the annealing temperature reaches 800° C., the broad peak at 37° is split as in dotted lines respectively indicating crystalline planes and thus the amorphous or microcrystalline structure is destroyed, showing that the Ta—CeO$_2$, diffusion barrier layer is crystallized.

As described above, the diffusion barrier layer for semiconductor device and the fabrication method thereof according to the present invention has several advantages. The diffusion barrier layer according to the present invention can be stable even at the high temperature of 800° C., since the insulating film is bonded to the refractory metal material in the diffusion barrier layer, while in the conventional nitrogen or oxygen stuffing, stuffed nitrogen or oxygen is diffused along the grain boundaries when annealing process is performed and thereby stuffing effect become extinct.

Further, the present invention does not induce the crystal defects in the thin film, due to the high ion energy needed to in conventional nitrogen or oxygen implantation by using the plasma treatment. In addition, since the refractory metal material and the insulating material constituent of the diffusion barrier layer according to the present invention are thermodynamically stable, reaction with the semiconductor substrate does not occur, thereby improving the reliability of the semiconductor device.

It will be apparent to those skilled in the art that various modifications and variations can be made in the diffusion barrier layer for the semiconductor device and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A thin film for a semiconductor device, comprising a diffusion barrier layer as a stuffed layer containing an insulating material bonded to a refractory metal material.

2. The thin film of claim 1, wherein the insulating material is formed of at least one of oxide or nitride.

3. The thin film of claim 1 wherein the refractory metal material is formed of at least one of 4B, 5B or 6B groups which include Ti, Ta, Mo and W.

4. The thin film of claim 1 wherein the diffusion barrier layer is in an amorphous or microcrystalline state.

5. The thin film of claim 1, wherein the thin film comprises Ta—CeO$_2$.

6. The thin film of claim 1, wherein the thin film has been formed by co-sputtering.

7. The thin film of claim 1, wherein the thin film is thermally stabilized.

8. A thin film for a semiconductor device, comprising a stuffed layer containing an insulating material bonded to a refractory metal material, wherein the insulating material is formed of at least one of oxide or nitride.

9. A thin film for a semiconductor device, comprising an insulating material bonded to a refractory metal material, wherein the thin film comprises Ta—CeO$_2$.

* * * * *